(12) United States Patent
Chen et al.

(10) Patent No.: US 12,283,308 B2
(45) Date of Patent: Apr. 22, 2025

(54) MEMORY DEVICE AND METHOD FOR OPERATING THE SAME

(71) Applicant: TAIWAN SEMICONDUCTOR MANUFACTURING COMPANY, LTD., Hsinchu (TW)

(72) Inventors: Kuang Ting Chen, Taipei (TW); Peijiun Lin, Kaohsiung (TW); Ching-Wei Wu, Nantou County (TW); Feng-Ming Chang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 178 days.

(21) Appl. No.: 18/152,635

(22) Filed: Jan. 10, 2023

(65) Prior Publication Data

US 2024/0079050 A1 Mar. 7, 2024

Related U.S. Application Data

(60) Provisional application No. 63/403,952, filed on Sep. 6, 2022.

(51) Int. Cl.
*G11C 11/00* (2006.01)
*G11C 11/408* (2006.01)
(Continued)

(52) U.S. Cl.
CPC ...... *G11C 11/4096* (2013.01); *G11C 11/4085* (2013.01); *G11C 11/4094* (2013.01)

(58) Field of Classification Search
CPC ......... G11C 11/419; G11C 7/227; G11C 7/06; G11C 11/5642; G11C 2211/5634; G11C 27/005; G11C 11/56; G11C 11/5621; G11C 11/5628; G11C 16/28; G11C 2211/5621; G11C 7/08; G11C 7/14; G11C 11/413; G11C 5/063; G11C 7/18; G11C 7/12; G11C 7/065; G11C 7/22; G11C 11/4094; G11C 11/4096; G11C 7/222; G11C 16/04; G11C 11/404; G11C 11/4045; G11C 11/405; G11C 11/4076; G11C 11/4091; G11C 11/412; G11C 11/417; G11C 11/565; G11C 16/30; G11C 2207/2254; G11C 7/02; G11C 7/1036; G11C 8/14; G11C 8/16;
(Continued)

(56) References Cited

U.S. PATENT DOCUMENTS 10,319,421 B2 * 6/2019 Su .................. G11C 11/419
2023/0064595 A1 * 3/2023 Huang ................. G11C 8/18

* cited by examiner

*Primary Examiner* — Thong Q Le
(74) *Attorney, Agent, or Firm* — Birch, Stewart, Kolasch & Birch, LLP

(57) ABSTRACT

A memory device is provided, including an array of bit cells and a set of tracking cells. The set of tracking cells is arranged adjacent to the array of bit cells along a first direction. The set of tracking cells includes a set of first tracking cells configured to perform a read tracking operation and a set of second tracking cells configured to perform a write tracking operation and arranged adjacent to the set of first tracking cells along a second direction. First tracking cells in the set of first tracking cells are coupled in series with each other and arranged along the second direction, and second tracking cells in the set of second tracking cells are coupled in series with each other and arranged along the second direction.

20 Claims, 5 Drawing Sheets

(51) Int. Cl.
*G11C 11/4094* (2006.01)
*G11C 11/4096* (2006.01)

(58) Field of Classification Search
CPC .............. G11C 11/418; G11C 5/025; G11C 2029/0409; G11C 2207/2281; G11C 29/023; G11C 29/028; G11C 11/41; G11C 29/50012; G11C 11/4085; G11C 29/50; G11C 29/52; G11C 29/54
See application file for complete search history.

MEMORY DEVICE AND METHOD FOR OPERATING THE SAME

CROSS REFERENCE

This application claims priority to U.S. Provisional Application Ser. No. 63/403,952, filed Sep. 6, 2022, which is herein incorporated by reference in its entirety.

BACKGROUND

In static random access memory (SRAM) devices, tracking schemes are adopted to control the length of word line window and the time to activate the sense amplifier. In addition, by separating the read and write tracking schemes, read/write active power and speed performance of the SRAM can be improved. However, separated tracking schemes usually require larger area so that periphery circuits can be arranged in the SRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
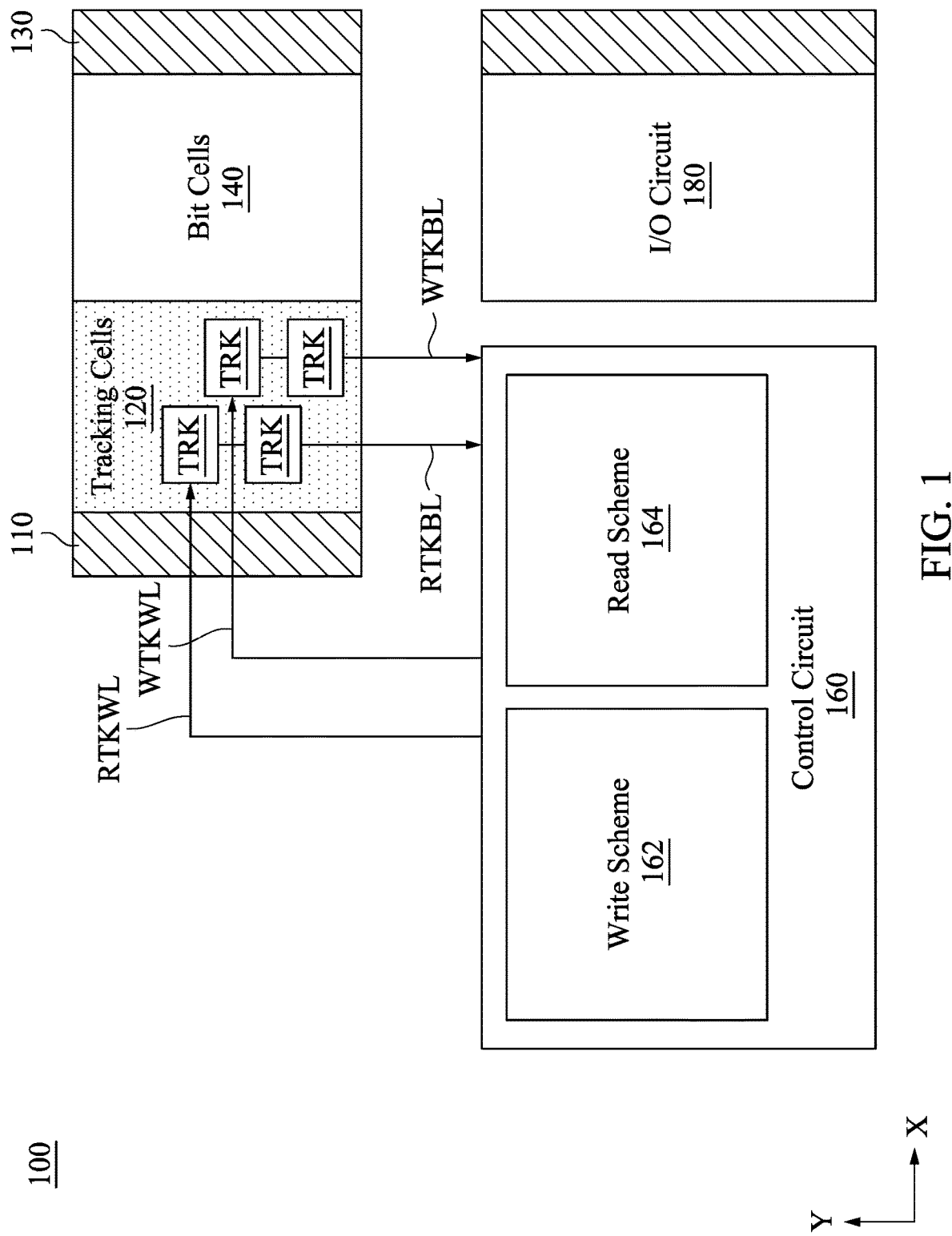
FIG. 1 is a schematic diagram of a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a memory device 100, in accordance with some embodiments of the present disclosure. For illustration, the memory device 100 includes a set of tracking cells 120, an array of bit cells 140, a control circuit 160, and an input/output (I/O) circuit 180.

For illustration of FIG. 1, a read tracking word line RTKWL is coupled between the control circuit 160 and the tracking cell TRK in the set of tracking cell 120, a read tracking bit line RTKBL is coupled between the tracking cell TRK and the control circuit 160, a write tracking word line WTKWL is coupled between the control circuit 160 and the tracking cell TRK in the set of tracking cell 120, a read tracking bit line RTKBL is coupled between the tracking cell TRK and the control circuit 160.

In some embodiments, the control circuit 160 is referred to as a main control (MCNT) circuit. In some embodiments, the read tracking word line RTKWL and the read tracking bit line RTKBL are configured for the control circuit 160 to execute a read tracking operation of the tracking cell TRK coupled to the read tracking word line RTKWL and the read tracking bit line RTKBL. For example, during the read tracking operation, the control circuit 160 outputs a tracking word line signal to the tracking cell TRK through the read tracking word line RTKWL, and the tracking cell TRK outputs a tracking signal to the control circuit 160 based on the received tracking word line signal.

Similarly, the write tracking word line WTKWL and the write tracking bit line WTKBL are configured for the control circuit 160 to execute a write tracking operation of the tracking cell TRK coupled to the write tracking word line WTKWL and the write tracking bit line WTKBL. For example, during the write tracking operation, the control circuit 160 outputs a tracking word line signal to the tracking cell TRK through the write tracking word line WTKWL, and the tracking cell TRK outputs a tracking signal to the control circuit 160 based on the received tracking word line signal.

For illustration of FIG. 1, the set of tracking cells 120 is arranged adjacent to the array of bit cells 140 along the X direction. The set of tracking cells 120 includes multiple tracking cells TRK. For simplicity of illustration, FIG. 1 merely illustrates two tracking cells TRK. The numbers of the tracking cells TRK are given for illustrative purposes. Various numbers of the tracking cells TRK are within the contemplated scope of the present disclosure.

In some embodiments, the tracking cells TRK are arranged in multiple columns along the Y direction, and the tracking cells TRK arranged in the same column are coupled in series with each other.

In some embodiments, the array of bit cells 140 includes multiple bit cells (not shown in FIG. 1) arranged in multiple columns and multiple rows. The bit cells are configured to store data or logic values. In some embodiments, the bit cells in the array of bit cells 140 are referred to as memory cells.

In some embodiments, each tracking cell TRK in the set of tracking cells 120 has the same configuration as the configuration of each bit cell in the array of bit cells 140. Thus, the tracking cells TRK is able to be used in a read/write tracking operation to imitate how the bit cells in the array of bit cells 140 operate during a read/write operation. Alternatively stated, the tracking cells TRK are configured to track the bit cells in the array of bit cells 140.

In some embodiments, the control circuit 160 is configured to execute a write scheme 162 and a read scheme 164. The write scheme 162 includes the write operation of the bit cells in the array of bit cell 140 and the write tracking operation of the tracking cells TRK in the set of tracking cells 120. The read scheme 164 includes the read operation of the bit cells in the array of bit cell 140 and the read tracking operation of the tracking cells TRK in the set of tracking cells 120.

Figure 2:
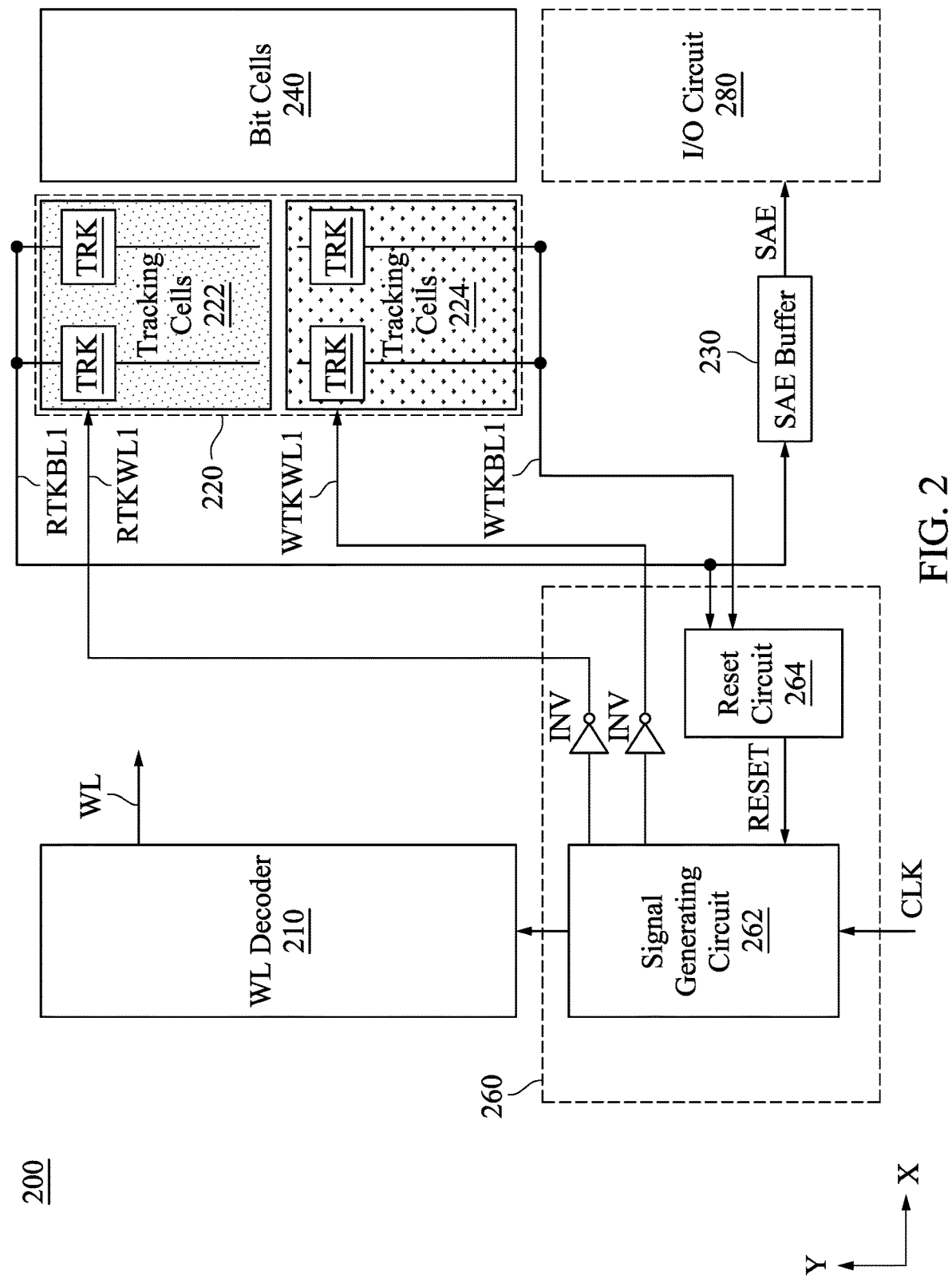
FIG. 2 is a schematic diagram of a memory device, in accordance with some embodiments of the present disclosure.

In some embodiments, the write scheme 162 and the read scheme 164 are implemented by the same circuit(s). In some other embodiments, each of the write scheme 162 and the read scheme 164 is implemented and performed by a signal generating circuit 262 and a reset circuit 264 as illustrated in FIG. 2.

In some embodiments, the I/O circuit 180 is a sense amplifier (SA) and is configured to read the data or logic values stored in the bit cells in the array of bit cells 140. In some embodiments, the I/O circuit 180 is coupled to the bit cells in the array of bit cells 140 through multiple electric lines (not shown in FIG. 1), for example, bit lines, source lines, and/or data lines.

In some embodiments, the I/O circuit 180 is referred to as a main input/output (MIO) circuit.

In some embodiments, the memory device 100 further includes a driver circuit (not shown in FIG. 1) configured to enable or disable word lines (not shown in FIG. 1) coupled to the bit cells in the array of bit cells 140 in order to perform read and write operations of the bit cells. In some embodiments, the driver circuit enables or disables word lines based on control signals generated by the control circuit 160. In some embodiments, the driver circuit is referred to as a word line decoder or a word line driver.

In some embodiments, the tracking signals output by the tracking cells TRK are configured for the control circuit 160 to enable or disable the word line(s) coupled to the bit cells in the array of bit cell 140 during the read/write operation.

In some embodiments, the tracking signals output by the tracking cells TRK are configured for the control circuit 160 to enable or disable the I/O circuit 180.

For illustration of FIG. 1, the memory device 100 includes a circuit 110. The circuit 110 is configured to protect the tracking cells TRK in the set of tracking cell 120. In some embodiments, the circuit 110 is referred to as an edge circuit or a periphery circuit.

For illustration of FIG. 1, the memory device 100 includes a circuit 130. The circuit 130 is configured to retain the data or logic values stored in the bit cells of the array of bit cell 140. In some embodiments, when the bit cells of the array of bit cell 140 are disabled or turned off, the circuit 130 is configured to maintain the voltage that the bit cells receive to a certain voltage level. In some embodiments, the circuit 130 includes an edge circuit, such as the circuit 110, and a retention circuit or retention diodes.

Reference is now made to FIG. 2. FIG. 2 is a schematic diagram of a memory device 200, in accordance with some embodiments of the present disclosure. For illustration, the memory device 200 includes a word line (WL) decoder 210, a set of tracking cells 220, an array of bit cells 240, a control circuit 260, a sense amplifier enabling (SAE) buffer 230, and an input/output (I/O) circuit 280.

Several components of the memory device 200 correspond to the components of the memory device 100 illustrated in FIG. 1. The set of tracking cells 220 corresponds to the set of tracking cells 120, the array of bit cells 240 corresponds to the array of bit cells 140, the control circuit 260 corresponds to the control circuit 160, and the I/O circuit 280 corresponds to the I/O circuit 180.

For illustration of FIG. 2, the set of tracking cells 220 is arranged adjacent to the array of bit cells 240 along the X direction and includes a set of tracking cells 222 and a set of tracking cells 224. Both of the set of tracking cells 222 and the set of tracking cells 224 are adjacent to and abut the array of bit cells 240. The set of tracking cells 222 and the set of tracking cells 224 are adjacent to each other along the Y direction and abut with each other.

In some embodiments, some or all of the components, such as the set of tracking cells 220, the set of tracking cells 224, and the array of bit cells 240, of the memory device 200 are arranged on a same substrate (not shown in FIG. 2). For illustration, the array of bit cells 240 is arranged in a first portion of the substrate, the set of tracking cells 222 is arranged in a second portion of the substrate, and the set of tracking cells is arranged in a third portion of the substrate. The second portion and the third portion are both adjacent to a first side of the first portion along the X direction and are adjacent to each other along the Y direction that is perpendicular to the X direction.

In some embodiments, the set of tracking cells 222 is configured to perform the read tracking operation, and the set of tracking cells 224 is configured to perform the write tracking operation. In various embodiments, the set of tracking cells 222 is configured to perform the write tracking operation, and the set of tracking cells 224 is configured to perform the read tracking operation.

In some embodiments, the memory device 200 further includes edge circuit(s) and retention circuit(s) (not shown in FIG. 2) arranged adjacent to the two sides of the set of tracking cells 220 and the array of bit cells 240, such as the circuits 110 and 130 arranged adjacent to the two sides of the set of tracking cells 120 and the array of bit cells 140 in FIG. 1.

In some examples, the set of tracking cells configured to perform the read tracking operation and the set of tracking cells configured to perform the write tracking operation are not adjacent or close to each other and do not abut with each other. Instead, the two sets of tracking cells are arranged at different or opposite sides of a memory device, and each of them is adjacent to and abuts a corresponding array of bit cells. Because the two sets of tracking cells are arranged at two sides of the memory device, such configuration is referred to as two-side architecture.

In the two-side architecture, one set of tracking cells and its corresponding array of bit cells need edge circuit(s) and retention circuit(s) arranged adjacent to them, just like the set of tracking cells 120 and the array of bit cells 140 illustrated in FIG. 1 need the circuits 110 and 130 arranged adjacent to them, in order to protect them and retain the data stored in the bit cells. As there are tracking cells and bit cells arranged at the two sides of the memory device, the edge circuits and retention circuits need to be arranged at the two sides of the memory device.

For the present disclosure, as illustrated in FIG. 2, the set of tracking cells 222 and the set of tracking cells 224 are arranged at the same side of the memory device 200 together, and can be referred to as a single set of tracking cells 220. Such configuration is referred to as one-side architecture.

In the one-side architecture, the set of tracking cells 220 and the array of bit cells 240 need edge circuit(s) and retention circuit(s) arranged adjacent to them as well. However, compared with the two-side architecture where there are edge circuits and retention circuits arranged at the two sides of the memory device, edge circuit(s) and retention circuit(s) need to be arranged at only one side of the memory device 200. Thus, by arranging less edge circuit(s) and retention circuit(s), the memory device 200 having the two-side architecture requires less area than the memory device having the one-side architecture requires. Alternatively stated, memory device having the two-side architecture is subject to area penalty compared with the memory device having the one-side architecture, such as the memory device 200 illustrated in FIG. 2.

For illustration of FIG. 2, both of the set of tracking cells 222 and the set of tracking cells 224 include their own tracking cells TRK. For simplicity of illustration, FIG. 2 merely illustrates two tracking cells TRK in the set of tracking cells 222 and two tracking cells TRK in the set of tracking cells 224. The numbers of the tracking cells TRK in the two sets are given for illustrative purposes. Various numbers of the tracking cells TRK are within the contemplated scope of the present disclosure.

In some embodiments, the tracking cells TRK in the set of tracking cells 222 are coupled in series with each other and arranged along the Y direction, and the tracking cells TRK in the set of tracking cells 224 are coupled in series with each other and arranged along the Y direction.

In some embodiments, each tracking cells TRK in the set of tracking cells 222 and the set of tracking cells 224 is coupled to a tracking word line, such as the read tracking word line RTKWL1 and the write tracking word line WTKWL1 illustrated in FIG. 2. The tracking word line is coupled between the control circuit 260 and one tracking cell TRK and is configured to turn on or off the corresponding tracking cell TRK.

In some embodiments, each tracking cell TRK in the set of tracking cells 222 and the set of tracking cells 224 is coupled to a ground voltage terminal and is configured to transmit the ground voltage when it is turned on by the word line coupled to it.

In some embodiments, the tracking cells TRK coupled in series in the set of tracking cells 222 and the set of tracking cells 224 are coupled between a high voltage level terminal and a tracking bit line, such as the read tracking bit line RTKBL1 and the write tracking bit line WTKBL1. When one or more of the tracking cells TRK coupled in series is turned by the corresponding word line(s), the high voltage level provided at the high voltage level terminal starts to be pulled down by the ground voltage that the tracking cells TRK receive. The resulting voltage level is transmitted through the tracking bit line coupled to the control circuit 260.

Alternatively stated, when some of the tracking cells TRK in the set of tracking cells 222 and the set of tracking cells 224 are turned on, the tracking cells TRK start to discharge and transmit, through the tracking bit line and to the control circuit 260, a tracking signal with a voltage level that goes from the high voltage level to the ground voltage level with certain speed. In some embodiments, such speed depends on the number of the tracking cells TRK that are turned on. Through the discharging of the tracking cells TRK and the tracking signals, the tracking cells TRK are configured to mimic or imitate how the bit cells in the array of bit cells 240 operate during the read/write operation.

For illustration of FIG. 2, the tracking cells TRK in the set of tracking cells 222 are arranged in two columns. The two columns extend along the Y direction and are adjacent to each other along the X direction. Similarly, the tracking cells TRK in the set of tracking cells 224 are arranged in two columns that extend along the Y direction and are adjacent to each other along the X direction.

In some embodiments, the specification of the memory device 200 requires the number of the tracking word lines coupled to the tracking cells TRK and/or the number of the tracking cells TRK to be above a minimum number. To meet such requirement, the tracking cells TRK in the set of tracking cells 222 and/or in the set of tracking cells 224 are arranged in two or more columns, so that more tracking cells TRK can be arranged.

For illustration of FIG. 2, the control circuit 260 includes a signal generating circuit 262 and a reset circuit 264. The signal generating circuit 262 is configured to transmit signals to different components of the memory device 200 in order to perform read, write, read tracking, and write tracking operations. For example, during the read tracking operation, the signal generating circuit 262 is configured to output a tracking word line signal to at least one tracking cell TRK in the set of tracking cells 222 through at least on read tracking word line, for example, the read tracking word line RTKWL1, based on a clock signal (CLK signal). As another example, during the write tracking operation, the signal generating circuit 262 is configured to output a tracking word line signal to at least one tracking cell TRK in the set of tracking cells 224 through at least on write tracking word line, for example, the write tracking word line WTKWL1, based on the CLK signal.

In some embodiments, the control circuit 260 further includes inverter(s) INV coupled between the signal generating circuit 262 and the read tracking word line RTKWL1 and/or between the signal generating circuit 262 and the write tracking word line WTKWL1, as illustrated in FIG. 2.

For illustration of FIG. 2, the reset circuit 264 is configured to transmit a RESET signal to reset the signal generating circuit 262 to switch to perform another operation. For example, when the reset circuit 264 receives the tracking signal from the set of tracking cells 222 through the read tracking word line RTKWL1, and the voltage level of the tracking signal becomes smaller than or equal to a threshold value, the reset circuit 264 is configured to transmit the RESET signal to the signal generating circuit 262, and the signal generating circuit 262 is configured to end the read tracking operation and perform another operation. As another example, when the reset circuit 264 receives the tracking signal from the set of tracking cells 224 through the write tracking word line WTKWL1, and the voltage level of the tracking signal becomes smaller than or equal to a threshold value, the reset circuit 264 is configured to transmit the RESET signal to the signal generating circuit 262, and the signal generating circuit 262 is configured to end the write tracking operation and perform another operation.

For illustration of FIG. 2, the word line decoder 210 is coupled to the signal generating circuit 262 of the control circuit 260 and is configured to enable or disable the word lines WL coupled to the bit cells in the array of bit cells 240 during the read/write operation. For example, during the read/write operation, the control circuit 260 receives a set of address indicating the selected bit cell(s), the control circuit 260 then controls the word line decoder 210 to enable the word line(s) WL coupled to the selected bit cell(s) according to the set of address, and thus data can be written into or read from the selected bit cell(s) through the word line decoder 210 and/or the I/O circuit 280.

For simplicity of illustration, FIG. 2 merely illustrates one word line WL, one read tracking bit line RTKBL1, one read tracking word line RTKWL1, one write tracking bit line WTKBL1, and one write tracking word line WTKWL1. The numbers of these electric lines are given for illustrative purposes. Various numbers of these electric lines are within the contemplated scope of the present disclosure.

In some embodiments, the I/O circuit 280 is coupled to the bit cells in the array of bit cells 240 through bit lines, source lines, and/or data lines and is configured to read the data or logic values stored in the bit cells during the read operation.

For illustration of FIG. 2, the SAE buffer 230 is configured to receive the tracking signal through the read tracking bit line RTKBL1 from the set of the tracking cells 222 and generate an SAE signal based on the tracking signal. The SAE signal is configured to enable the I/O circuit 280, and the I/O circuit 280 is configured to sense, read, or detect the data stored in the bit cells.

For illustration of FIG. 2, the control circuit 260 is configured to output at least one first tracking word line signal to at least one tracking cell TRK in the set of tracking cells 222 through the read tracking word line RTKWL1 based on the CLK signal, and the set of tracking cells 222 is configured to output a first tracking signal back to the control circuit 260 through the read tracking bit line RTKBL1 based on the at least one tracking word line signal. When the voltage level of the first tracking signal received by the control circuit 260 is smaller than or equal to a threshold value, the control circuit 260 is further configured to output at least one second tracking word line signal to at least one tracking cell TRK in the set of tracking cells 224 through the write tracking word line WTKWL1, and the set of tracking cells 224 is configured to output a second tracking signal back to the control circuit 260 through the write tracking bit line WTKBL1 based on the at least one second tracking word line signal.

Figure 3:
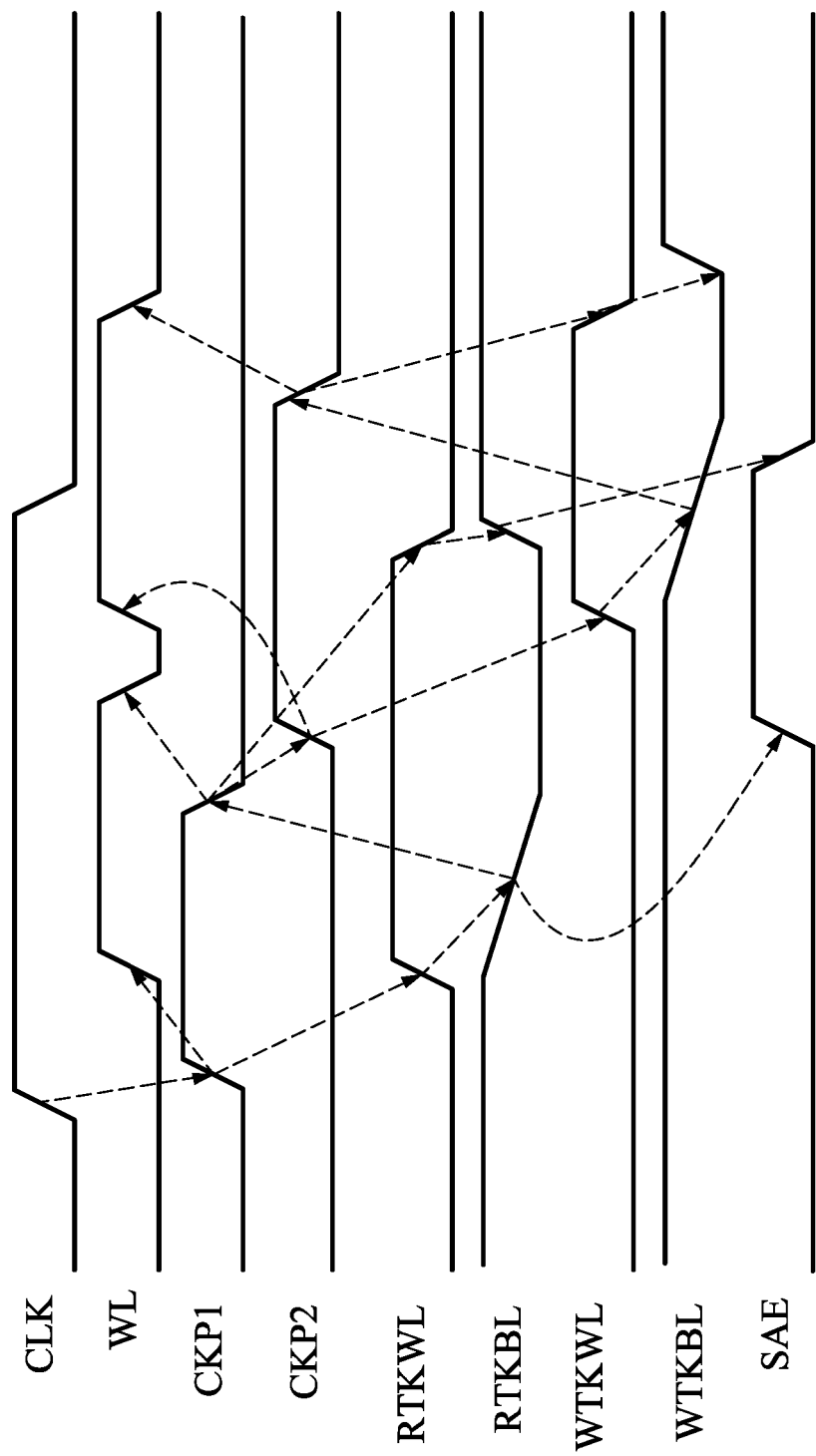
FIG. 3 is a waveform diagram of signals transmitted in the memory device shown in FIG. 2, in accordance with some embodiments of the present disclosure.

Reference is now made to FIG. 3. FIG. 3 is a waveform diagram of signals transmitted in the memory device 200 shown in FIG. 2, in accordance with some embodiments of the present disclosure. The CLK signal is denoted as "CLK" in FIG. 3, the signal transmitted through the word line WL is denoted as "WL" in FIG. 3, the signal transmitted through the read tracking word line RTKWL1 is denoted as "RTKWL" in FIG. 3, the signal transmitted through the read tracking bit line RTKBL1 is denoted as "RTKBL" in FIG. 3, the signal transmitted through the write tracking word line WTKWL1 is denoted as "WTKWL" in FIG. 3, the signal transmitted through the write tracking bit line WTKBL1 is denoted as "WTKBL" in FIG. 3, and the SAE signal is denoted as "SAE" in FIG. 3.

For illustration of FIG. 3, CKP1 and CKP2 signals are internal signals of the signal generating circuit 262 illustrated in FIG. 2. The CKP1 signal is configured for the signal generating circuit 262 to perform the read tracking operation, and the CKP2 signal is configured for the signal generating circuit 262 to perform the write tracking operation. For example, when the CKP1 signal has a high logic value or high voltage level, the signal generating circuit 262 is configured to perform the read tracking operation, and when the CKP1 signal has a low logic value or low voltage level, the signal generating circuit 262 is configured to end the read tracking operation.

For illustration of FIG. 3, in response to a rising edge of the CLK signal, the CKP1 signal rises. In response to the rising edge of the CKP1 signal, the WL signal and the RTKWL signal rise. In response to the rising edge of the RTKWL signal, the RTKBL signal falls. In response to the falling edge of the RTKBL signal, the CKP1 signal falls and the SAE signal rises. In response to the falling edge of the CKP1 signal, the WL signal and the RTKWL signal fall, and the CKP2 signal rises. In response to the rising edge of the CKP2 signal, the WL signal and the WTKWL signal rise. In response to the rising edge of the WTKWL signal, the WTKBL signal falls. In response to the falling edge of the WTKBL signal, the CKP2 signal falls. In response to the falling edge of the CKP2 signal, the WL signal and the WTKWL signal fall. In response to the falling edge of the WTKWL signal, the WTKBL signal rises. In response to the falling edge of the RTKWL signal, the RTKBL signal rises. In response to the rising edge of the RTKBL signal, the SAE signal falls.

With reference to FIGS. 2 and 3, the following paragraphs discuss the operations of the memory device 200 under a two-port design. In the two-port design, the memory device 200 receives two sets of addresses, that is, one set of read address and one set of write address, and the memory device 200 can perform read tracking operation and write tracking operation in the same cycle. For example, the memory device 200 can perform the write tracking operation shortly after the read tracking operation.

The signal generating circuit 262 transmits a first tracking word line signal through the read tracking word line RTKWL1 to the set of tracking cells 222 based on the CLK signal. The set of tracking cells 222 outputs a first tracking signal through the read tracking bit line RTKBL1 to the SAE buffer 230, and then the SAE buffer 230 transmits the SAE signal to the I/O circuit 280. Thus, when the I/O circuit 280 receives the SAE signal, the I/O circuit 280 starts sensing currents flowing from the bit cells of the array of bit cells 240.

For illustration of FIG. 3, the CKP1 signal, which is an internal signal of the signal generating circuit 262, is generated based on the CLK signal, the RTKWL signal is generated based on the CKP1 signal, the RTKBL signal is generated based on the RTKWL signal, and the SAE signal is generated based on the RTKBL signal.

The signal generating circuit 262 controls the word line decoder 210 to enable the word line(s) WL coupled to the bit cells based on a set of read address. Thus, the word line(s) WL configured to perform the read operation is enabled.

For illustration of FIG. 3, the WL signal is generated based on the CKP1 signal.

As illustrated in FIG. 2, the first tracking signal is also transmitted through the read tracking bit line RTKBL1 to the reset circuit 264. When the RTKBL signal received by the reset circuit 264 falls below a certain threshold value, the reset circuit 264 outputs the RESET signal to the signal generating circuit 262, and the signal generating circuit 262 controls the word line decoder 210 to disable the word line(s) WL. Thus, the read tracking operation ends.

For illustration of FIG. 3, the CKP1 signal falls in response to the falling edge of the RTKBL signal, and the WL signal falls in response to the falling edge of the CKP1 signal.

After the signal generating circuit 262 controls the word line decoder 210 to disable the word line(s) WL, the signal generating circuit 262 then controls the word line decoder 210 to enable the word line(s) WL coupled to the bit cells based on a set of write address. Thus, the word line(s) WL configured to perform the write operation is enabled.

For illustration of FIG. 3, the CKP2 signal is generated in response to the falling edge of the CKP1 signal, and the WL signal is generated in response to the CKP2 signal.

It is worth noted that the word lines WL enabled during the read and write operations respectively depend on the read address and the write address. In some embodiments, the word line(s) WL enabled after the read operation and during the write operation is the same as the word line(s) WL enabled during the read operation. In various embodiments, the word line(s) WL enabled after the read operation and during the write operation is different from the word line(s) WL enabled during the read operation.

The signal generating circuit 262 transmits a second tracking word line signal through the write tracking word line WTKWL1 to the set of tracking cells 224. The set of tracking cells 224 outputs a second tracking signal through the write tracking bit line WTKBL1 to the reset circuit 264. When the WTKBL signal received by the reset circuit 264 falls below a certain threshold value, the reset circuit 264 outputs the RESET signal to the signal generating circuit 262, and the signal generating circuit 262 controls the word line decoder 210 to disable the word line(s) WL. Thus, the write tracking operation ends.

For illustration of FIG. 3, the WTKWL signal is generated based on the CKP2 signal, the WTKBL signal falls based on the WTKWL signal, the CKP2 signal falls based on the WTKBL signal, and the WL signal falls based on the CKP2 signal.

When the read tracking operation ends, the signal generating circuit 262 disables the read tracking word line RTKWL1, and the tracking cell(s) TRK coupled to the read tracking word line RTKWL1 is turned off. Because the tracking cell(s) TRK in the set of tracking cells 222 is turned off, the signal of the read tracking bit line RTKBL1 is back to high voltage level. When the SAE buffer 230 receives the signal with high voltage level through the read tracking bit line RTKBL1, the SAE buffer 230 disables the I/O circuit 280.

For illustration of FIG. 3, the RTKWL signal falls in response to the falling edge of the CKP1 signal, the RTKBL signal rises in response to the falling edge of the RTKWL signal, and the SAE signal falls in response to the rising edge of the RTKBL signal.

When the write tracking operation ends, the signal generating circuit 262 disables the write tracking word line WTKWL1, and the tracking cell(s) TRK coupled to the write tracking word line WTKWL1 is turned off. Because the tracking cell(s) TRK in the set of tracking cells 224 is turned off, the signal of the write tracking bit line WTKBL1 is back to high voltage level.

For illustration of FIG. 3, the WTKWL signal falls in response to the falling edge of the CKP2 signal, and the WTKBL signal rises in response to the falling edge of the WTKWL signal.

In some embodiments, with reference to FIG. 2, the memory device 200 is under a one-port design. In the one-port design, the memory device 200 receives one set of address at a time and performs read tracking operation and write tracking operation in different cycles. The following paragraphs discuss the operations of the memory device 200 under the one-port design.

The signal generating circuit 262 transmits a first tracking word line signal through the read tracking word line RTKWL1 to the set of tracking cells 222 based on the CLK signal. The set of tracking cells 222 outputs a first tracking signal through the read tracking bit line RTKBL1 to the SAE buffer 230, and then the SAE buffer 230 transmits the SAE signal to the I/O circuit 280. Thus, when the I/O circuit 280 receives the SAE signal, the I/O circuit 280 starts sensing currents flowing from the bit cells of the array of bit cells 240.

The signal generating circuit 262 controls the word line decoder 210 to enable the word line(s) WL coupled to the bit cells based on a set of read address. Thus, the word line(s) WL configured to perform the read operation is enabled.

As illustrated in FIG. 2, the first tracking signal is also transmitted through the read tracking bit line RTKBL1 to the reset circuit 264. When the signal received by the reset circuit 264 falls below a certain threshold value, the reset circuit 264 outputs the RESET signal to the signal generating circuit 262, and the signal generating circuit 262 controls the word line decoder 210 to disable the word line(s) WL. Thus, the read tracking operation ends.

The write tracking operation starts in a different cycle. The signal generating circuit 262 controls the word line decoder 210 to enable the word line(s) WL coupled to the bit cells based on a set of write address. Thus, the word line(s) WL configured to perform the write operation is enabled.

The signal generating circuit 262 transmits a second tracking word line signal through the write tracking word line WTKWL1 to the set of tracking cells 224. The set of tracking cells 224 outputs a second tracking signal through the write tracking bit line WTKBL1 to the reset circuit 264. When the signal received by the reset circuit 264 falls below a certain threshold value, the reset circuit 264 outputs the RESET signal to the signal generating circuit 262, and the signal generating circuit 262 controls the word line decoder 210 to disable the word line(s) WL. Thus, the write tracking operation ends.

Figure 4:
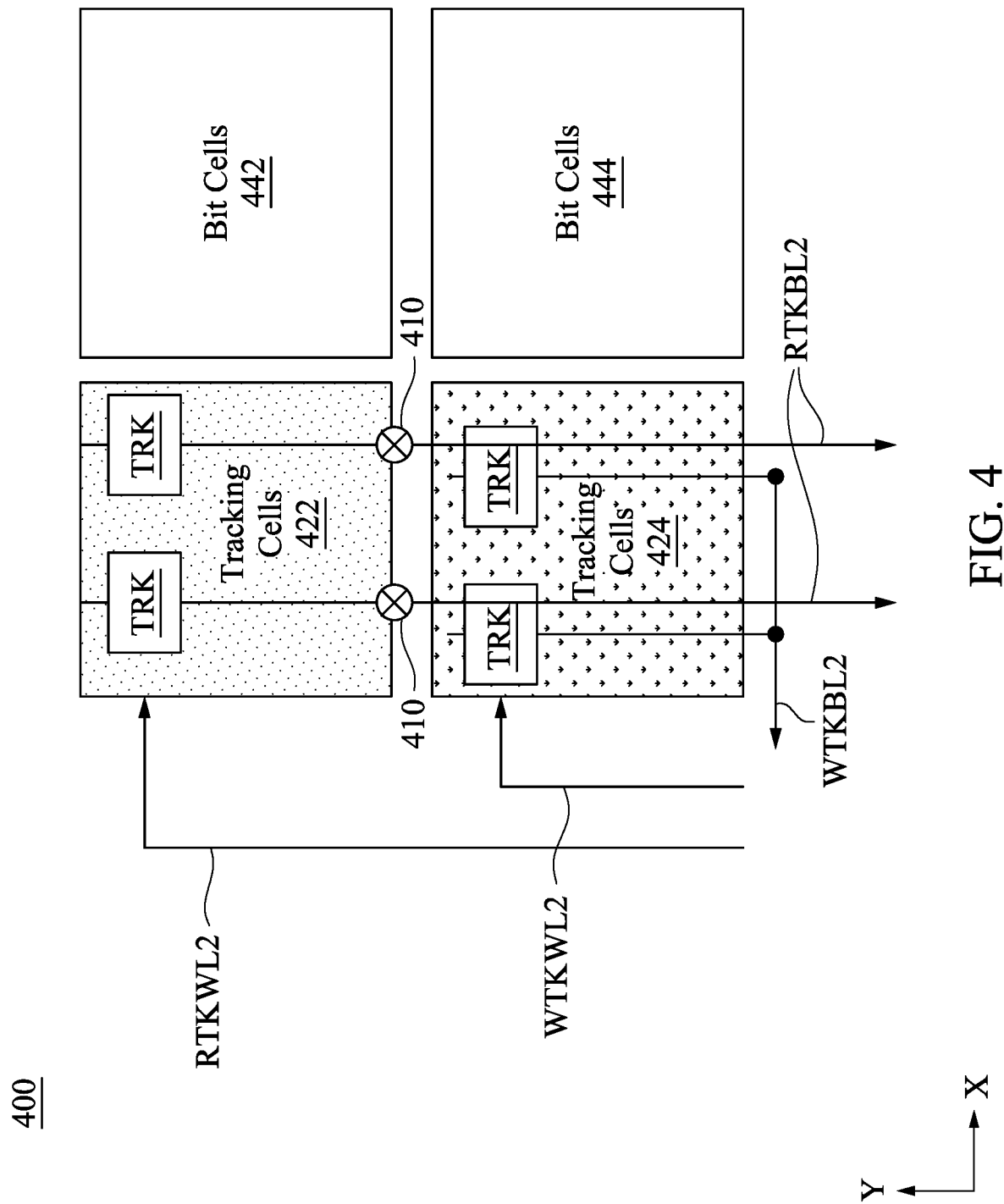
FIG. 4 is a schematic diagram of a portion of a memory device, in accordance with some embodiments of the present disclosure.

Reference is now made to FIG. 4. FIG. 4 is a schematic diagram of a portion of a memory device 400, in accordance with some embodiments of the present disclosure. For illustration, the memory device 400 includes a set of tracking cells 422, a set of tracking cells 424, an array of bit cells 442, and an array of bit cells 444. FIG. 4 merely illustrates a portion of the memory device 400, and many components of the memory device 400 are the same as or similar to those in the memory device 200 illustrated in FIG. 2 and are omitted in FIG. 4. For example, in some embodiments, the memory device 400 includes a word line decoder such as the word line decoder 210, a control circuit such as the control circuit 260, a SAE buffer such as the SAE buffer 230, and a I/O circuit such as the I/O circuit 280.

For illustration of FIG. 4, the set of tracking cells 422 is arranged adjacent to the array of bit cells 442 along the X direction, and the set of tracking cells 424 is arranged adjacent to the array of bit cells 444 along the X direction. The set of tracking cells 422 and the set of tracking cells 424 are adjacent to each other along the Y direction and abut with each other.

For illustration of FIG. 4, both of the set of tracking cells 422 and the set of tracking cells 424 include their own tracking cells TRK. For simplicity of illustration, FIG. 4 merely illustrates two tracking cells TRK for each of the set of tracking cells 422 and the set of tracking cells 424. In some embodiments, each of the set of tracking cells 422 and the set of tracking cells 424 includes multiple tracking cells TRK coupled in series.

For illustration of FIG. 4, a read tracking word line RTKWL2 is coupled to at least one tracking cell TRK in the set of tracking cells 422 and configured to transmit a read tracking word line signal to the at least one tracking cell TRK. Similarly, a write tracking word line WTKWL2 is coupled to at least one tracking cell TRK in the set of tracking cells 424 and configured to transmit a write tracking word line signal to the at least one tracking cell TRK.

For illustration of FIG. 4, a pair of read tracking bit lines RTKBL2 is coupled to the tracking cells TRK in the set of tracking cells 422 through a pair of conductive segments 410, and a write tracking bit line WTKBL2 is coupled to the tracking cells TRK in the set of tracking cells 424. In some embodiments, the conductive segment 410 is via made of conductive material, such as metal, and configured to transmit signals.

In some embodiments, the pair of read tracking bit lines RTKBL2 is coupled together to a control circuit, such as the control circuit 160 or 260 illustrated in FIGS. 1-2, and can be referred to as a single read tracking bit line RTKBL2.

In some embodiments, the read tracking bit line RTKBL2 is configured to transmit a first tracking signal from the set of tracking cells 422 to a control circuit, and the write tracking bit line WTKBL2 is configured to transmit a second tracking signal from the set of tracking cells 424 to the control circuit.

For illustration of FIG. 4, a portion of the read tracking bit line RTKBL2 and a portion of the write tracking bit line WTKBL2 are arranged at the same side of the sets of tracking cell 422 and 424, to be below the set of tracking cells 424. On the other hand, for illustration of FIG. 2, a portion of the read tracking bit line RTKBL1 and a portion of the write tracking bit line WTKBL1 are arranged at opposite sides of the sets of tracking cells 222 and 224 and extend along the X direction. Alternatively stated, a portion of the read tracking bit line RTKBL1 that extends along the X direction is above the set of tracking cells 222, and a portion of the write tracking bit line WTKBL1 that extends along the X direction is below the set of tracking cells 224.

For illustration of FIG. 4, a portion of the read tracking bit line RTKBL2 extends across the set of tracking cells 424. In some embodiments, a portion of the read tracking bit line RTKBL2 is arranged in a first layer, and a portion of write tracking bit line WTKBL2 is arranged in a second layer that is different from the first layer. In some embodiments, the first layer is higher than the second layer, and the read tracking bit line RTKBL2 is referred to as a flying tracking bit line.

In some embodiments, the array of bit cells 442 is coupled to at least one bit line extending across the array of bit cells 444 and arranged in a layer that is higher than the layer where the array of bit cells 444 is arranged. In some embodiments, the at least one bit line coupled to the array of bit cells 442 is referred to as a flying bit line.

The arrangements of the sets of tracking cells 422 and 424, the arrays of bit cells 442 and 444, the read tracking word line RTKWL2, the write tracking word line WTKWL2, the read tracking bit line RTKBL2, the write tracking bit line WTKBL2, and the conductive segments 410 in the memory device 400, as discussed above, are given for illustrative purposes. Various arrangements are within the contemplated scope of the present disclosure. For example, in various embodiments, the memory device 400 includes a read tracking bit line arranged above the set of tracking cells 422 and coupled to the set of tracking cells 422 and a pair of write tracking bit lines coupled to the set of tracking cells 424 and extending across the set of tracking cells 422 and to the upper side of the set of tracking cells 422.

Figure 5:
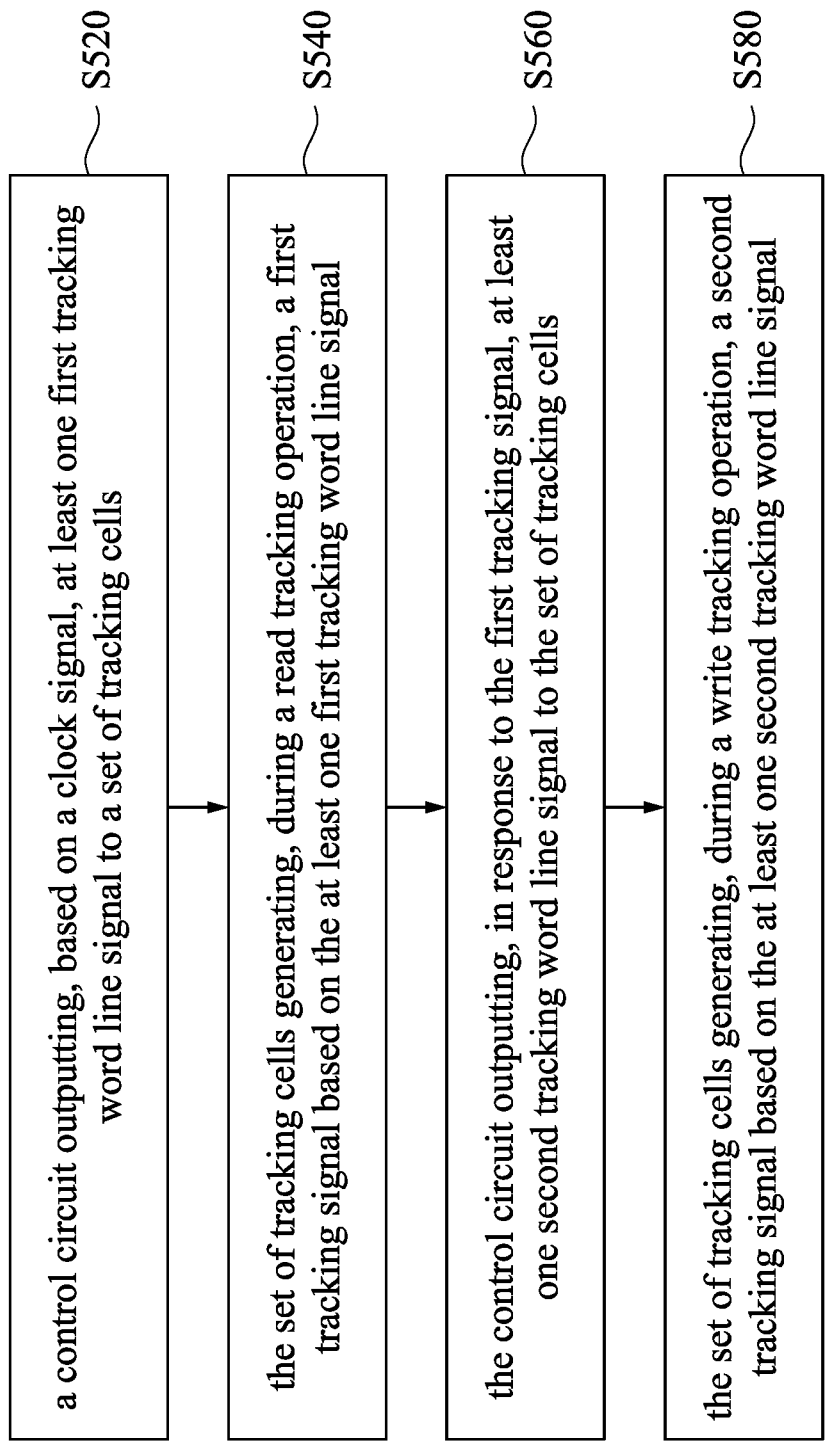
FIG. 5 is a flowchart of a method for operating the memory devices shown in FIGS. 1-2 and 4, in accordance with some embodiments of the present disclosure.

Reference is now made to FIG. 5. FIG. 5 is a flowchart of a method 500 for operating the memory devices 100, 200, and 400 shown in FIGS. 1-2 and 4, in accordance with some embodiments of the present disclosure. For illustration, the method 500 includes steps S520, S540, S560, and S580. The method 500 and its steps can be implemented through the configurations illustrated in FIGS. 1-2 and 4.

At step S520, a control circuit outputs, based on a clock signal, at least one first tracking word line signal to a set of tracking cells which abuts an array of bit cells. In some embodiments, the control circuit outputs, based on the clock signal, the at least one first tracking word line signal to a set of first tracking cells in the set of tracking cells. For example, as illustrated in FIG. 2, the control circuit 260 outputs, based on the CLK signal, a first tracking word line signal through the read tracking word line RTKWL1 to the set of tracking cells 222 in the set of tracking cells 220 which abuts the array of bit cells 240.

At step S540, the set of tracking cells generates, during a read tracking operation, a first tracking signal based on the at least one first tracking word line signal. In some embodiments, the set of first tracking cells in the set of tracking cells generates the first tracking signal based on the at least one first tracking word line signal. For example, as illustrated in FIG. 2, the set of tracking cells 222 generates, during the read tracking operation, a first tracking signal based on the one first tracking word line signal. The set of tracking cells 222 then transmits such first tracking signal back to the control circuit 260 through the read tracking bit line RTKBL1.

At step S560, the control circuit outputs, in response to the first tracking signal, at least one second tracking word line signal to the set of tracking cells. In some embodiments, the control circuit outputs, in response to the first tracking signal, the at least one second tracking word line signal to a set of second tracking cells in the set of tracking cells. For example, as illustrated in FIG. 2, the control circuit 260 outputs, in response to the first tracking signal, a second tracking word line signal to the set of tracking cells 224 in the set of tracking cells 220 through the write tracking word line WTKWL1.

At step S580, the set of tracking cells generates, during a write tracking operation, a second tracking signal based on the at least one second tracking word line signal. In some embodiments, the set of second tracking cells in the set of tracking cells generates the second tracking signal based on the at least one second tracking word line signal. For example, as illustrated in FIG. 2, the set of tracking cells 224 generates, during the write tracking operation, a second tracking signal based on the second tracking word line signal. The set of tracking cells 224 then transmits such second tracking signal back to the control circuit 260 through the write tracking bit line WTKBL1.

In some embodiments, as illustrated in FIG. 2, the set of tracking cells 220 includes the set of tracking cells 222 and the set of tracking cells 224 which abut with each other. The tracking cells TRK in the set of tracking cells 222 are arranged in at least one column, and the tracking cells TRK in the same column are coupled in series with each other. Similarly, the tracking cells TRK in the set of tracking cells 224 are arranged in at least one column, and the tracking cells TRK in the same column are coupled in series with each other.

In some embodiments, the method 500 further includes a step that a decoder circuit enables a first word line. For example, as illustrated in FIG. 2, the word line decoder 210 enables the word line(s) WL coupled to the bit cell(s) in the array of bit cells 240 based on the set of read address.

In some embodiments, the method 500 further includes a step that the decoder circuit, in response to the first tracking signal, disables the first word line and enables a second word line. For example, as illustrated in FIG. 2, when the control circuit 260 receives the first tracking signal through the read tracking bit line RTKBL1 from the set of tracking cells 222, the control circuit 260 controls the word line decoder 210 to disable the word line(s) WL that was enabled based on the set of read address and then enable the same or different word line(s) WL based on the set of write address.

In some embodiments, the method 500 further includes a step that the decoder circuit, in response to the second tracking signal, disables the second word line. For example, as illustrated in FIG. 2, when the control circuit 260 receives the second tracking signal through the write tracking bit line WTKBL1 from the set of tracking cells 224, the control circuit 260 controls the word line decoder 210 to disable the word line(s) WL that was enabled based on the set of write address.

As described above, the present disclosure provides a memory device that includes two sets of tracking cells respectively configured for read tracking operation and write tracking operation and arranged at the same side of the memory device. Thus, because the tracking cells are arranged at only one side of the memory device, the area that the periphery circuits use can be reduced. Such memory device having one-side decode architecture can be used for various compiler designs, such as one-port and two-port compiler designs.

In some embodiments, a memory device is provided, including a memory array, a driver circuit, and a recover circuit. The memory array includes multiple memory cells. Each one of the memory cells is coupled to a control line, a data line, and a source line and, during a normal operation, is configured to receive a first voltage signal through the control line and to receive a second voltage signal through at least one of the data line or the source line. The driver circuit is coupled to the memory cells and configured to output at least one of the first voltage signal or the second voltage signal to each one of the memory cells. The recover circuit is configured to output, during a recover operation, a third voltage signal, through the driver circuit to at least one of the memory cells. The third voltage signal is configured to have a first voltage level that is higher than a highest level of the first voltage signal or the second voltage signal, or lower than a lowest level of the first voltage signal or the second voltage signal.

In some embodiments, the memory device further includes a control circuit. The control circuit is configured to output at least one first tracking word line signal to at least one first tracking cell in the set of first tracking cells through at least one first tracking word line based on a clock signal, and the set of first tracking cells is configured to output a first tracking signal to the control circuit based on the at least one first tracking word line signal. In response to a voltage level of the first tracking signal being smaller than or equal to a first threshold value, the control circuit is further configured to output at least one second tracking word line signal to at least one second tracking cell in the set of second tracking cells through at least one second tracking word line, and the set of second tracking cells is configured to output a second tracking signal to the control circuit based on the at least one second tracking word line signal.

In some embodiments, the memory device further includes a first tracking bit line and a second tracking bit line. The first tracking bit line is configured to transmit the first tracking signal from the set of first tracking cells to the control circuit. The second tracking bit line is configured to transmit the second tracking signal from the set of second tracking cells to the control circuit.

In some embodiments, a portion of the first tracking bit line and a portion of the second tracking bit line are arranged at opposite sides of the set of tracking cells and extend along the first direction.

In some embodiments, a portion of the first tracking bit line and a portion of the second tracking bit line are arranged at a same side of the set of tracking cells.

In some embodiments, a portion of first tracking bit line extends across the set of second tracking cells, or a portion of the second tracking bit line extends across the set of first tracking cells.

In some embodiments, a portion of the first tracking bit line is arranged in a first layer, and a portion of second tracking bit line is arranged in a second layer that is different from the first layer.

In some embodiments, the first tracking cells are arranged in two or more columns that extend along the second direction and are adjacent to each other along the first direction, and the second tracking cells are arranged in two or more columns that extend along the second direction and are adjacent to each other along the first direction.

In some embodiments, the memory device further includes a signal generating circuit and a reset circuit. The signal generating circuit is configured to generate at least one first tracking word line signal and at least one second tracking word line signal based on a clock signal. The reset circuit is coupled to the signal generating circuit and is configured to, in response to receiving a tracking signal having a voltage level that is smaller than or equal to a threshold value, reset the signal generating circuit.

In some embodiments, a memory device is provided, including an array of bit cells, a set of first tracking cells, a set of second tracking cells, and a control circuit. The array of bit cells is arranged in a first portion of a substrate. The set of first tracking cells is arranged in a second portion of the substrate. The set of second tracking cells is arranged in a third portion of the substrate. The second portion and the third portion are both adjacent to a first side of the first portion along a first direction and are adjacent to each other along a second direction that is perpendicular to the first direction. The control circuit is configured to transmit at least one first tracking word line signal to the set of first tracking cells for performing a read tracking operation, and is configured to transmit at least one second tracking word line signal to the set of second tracking cells for performing a write tracking operation.

In some embodiments, the set of first tracking cells is configured to output a first tracking signal to the control circuit based on the at least one first tracking word line signal, the control circuit is further configured to output at least one second tracking word line signal to at least one second tracking cell in the set of second tracking cells based on the first tracking signal, and the set of second tracking cells is configured to output a second tracking signal to the control circuit based on the at least one second tracking word line signal.

In some embodiments, the memory device further includes a first tracking bit line and a second tracking bit line. The first tracking bit line is configured to transmit the first tracking signal from the set of first tracking cells to the control circuit. The second tracking bit line is configured to transmit the second tracking signal from the set of second tracking cells to the control circuit.

In some embodiments, a portion of the first tracking bit line and a portion of the second tracking bit line are arranged at opposite sides of the set of tracking cells and extend along the first direction.

In some embodiments, a portion of the first tracking bit line and a portion of the second tracking bit line are arranged at a same side of the set of tracking cells.

In some embodiments, a portion of first tracking bit line extends across the set of second tracking cells, or a portion of the second tracking bit line extends across the set of first tracking cells.

In some embodiments, a portion of the first tracking bit line is arranged in a first layer, and a portion of second tracking bit line is arranged in a second layer that is different from the first layer.

In some embodiments, a method is provided, including: a control circuit outputting, based on a clock signal, at least one first tracking word line signal to a set of tracking cells which abuts an array of bit cells; the set of tracking cells generating, during a read tracking operation, a first tracking signal based on the at least one first tracking word line signal; the control circuit outputting, in response to the first tracking signal, at least one second tracking word line signal to the set of tracking cells; and the set of tracking cells generating, during a write tracking operation, a second tracking signal based on the at least one second tracking word line signal.

In some embodiments, the set of tracking cells includes a set of first tracking cells and a set of second tracking cells which abut with each other. First tracking cells in the set of first tracking cells are arranged in at least one first column, and the first tracking cells in the at least one first column are coupled in series with each other. Second tracking cells in the set of second tracking cells are arranged in at least one second column, and the second tracking cells in the at least one second column are coupled in series with each other.

In some embodiments, the control circuit outputting, based on the clock signal, the at least one first tracking word line signal to the set of tracking cells includes the control circuit outputting, based on the clock signal, the at least one first tracking word line signal to the set of first tracking cells. The set of tracking cells generating, during the read tracking operation, the first tracking signal based on the at least one first tracking word line signal includes the set of first tracking cells generating the first tracking signal based on the at least one first tracking word line signal. The control circuit outputting, in response to the first tracking signal, the at least one second tracking word line signal to the set of tracking cells includes the control circuit outputting, in response to the first tracking signal, the at least one second tracking word line signal to the set of second tracking cells. The set of tracking cells generating, during the write tracking operation, the second tracking signal based on the at least one second tracking word line signal includes the set of second tracking cells generating the second tracking signal based on the at least one second tracking word line signal.

In some embodiments, the method further includes: a decoder circuit, in response to the first tracking signal, disabling a first word line and enabling a second word line; and the decoder circuit, in response to the second tracking signal, disabling the second word line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    an array of bit cells; and
    a set of tracking cells arranged adjacent to the array of bit cells along a first direction, and comprising:
        a set of first tracking cells coupled to a first tracking bit line for transmitting a first tracking signal corresponding to a read tracking operation; and
        a set of second tracking cells coupled to a second tracking bit line, separated from the first tracking bit line, for transmitting a second tracking signal corresponding to a write tracking operation,
        wherein the set of second tracking cells are arranged adjacent to the set of first tracking cells along a second direction that is different from the first direction;
        wherein first tracking cells in the set of first tracking cells are coupled in series with each other and arranged along the second direction, and second tracking cells in the set of second tracking cells are coupled in series with each other and arranged along the second direction.

2. The memory device of claim 1, further comprising:
    a control circuit, wherein the control circuit is configured to output at least one first tracking word line signal to at least one first tracking cell in the set of first tracking cells through at least one first tracking word line based on a clock signal, and the set of first tracking cells is configured to output the first tracking signal to the control circuit based on the at least one first tracking word line signal;

wherein, in response to a voltage level of the first tracking signal being smaller than or equal to a first threshold value, the control circuit is further configured to output at least one second tracking word line signal to at least one second tracking cell in the set of second tracking cells through at least one second tracking word line, and the set of second tracking cells is configured to output the second tracking signal to the control circuit based on the at least one second tracking word line signal.

3. The memory device of claim 2, wherein the first tracking bit line is configured to transmit the first tracking signal from the set of first tracking cells to the control circuit; and the second tracking bit line is configured to transmit the second tracking signal from the set of second tracking cells to the control circuit.

4. The memory device of claim 3, wherein a portion of the first tracking bit line and a portion of the second tracking bit line are arranged at opposite sides of the set of tracking cells and extend along the first direction.

5. The memory device of claim 3, wherein a portion of the first tracking bit line and a portion of the second tracking bit line are arranged at a same side of the set of tracking cells.

6. The memory device of claim 3, wherein a portion of first tracking bit line extends across the set of second tracking cells, or a portion of the second tracking bit line extends across the set of first tracking cells.

7. The memory device of claim 3, wherein a portion of the first tracking bit line is arranged in a first layer, and a portion of second tracking bit line is arranged in a second layer that is different from the first layer.

8. The memory device of claim 1, wherein the first tracking cells are arranged in two or more columns that extend along the second direction and are adjacent to each other along the first direction, and the second tracking cells are arranged in two or more columns that extend along the second direction and are adjacent to each other along the first direction.

9. The memory device of claim 1, further comprising:

a signal generating circuit configured to generate at least one first tracking word line signal and at least one second tracking word line signal based on a clock signal; and a reset circuit coupled to the signal generating circuit and configured to, in response to receiving a tracking signal having a voltage level that is smaller than or equal to a threshold value, reset the signal generating circuit.

10. A memory device, comprising:

an array of bit cells arranged in a first portion of a substrate;

a set of first tracking cells that are coupled to a first tracking bit line for transmitting a first tracking signal corresponding to a read tracking operation and are arranged in a second portion of the substrate;

a set of second tracking cells that are coupled to a second tracking bit line for transmitting a second tracking signal corresponding to a write tracking operation and are arranged in a third portion of the substrate, wherein the second portion and the third portion are both adjacent to a first side of the first portion along a first direction and are adjacent to each other along a second direction that is perpendicular to the first direction; and a control circuit configured to transmit at least one first tracking word line signal to the set of first tracking cells for performing the read tracking operation, and configured to transmit at least one second tracking word line signal to the set of second tracking cells for performing the write tracking operation.

11. The memory device of claim 10, wherein the set of first tracking cells is configured to output the first tracking signal to the control circuit based on the at least one first tracking word line signal, the control circuit is further configured to output at least one second tracking word line signal to at least one second tracking cell in the set of second tracking cells based on the first tracking signal, and the set of second tracking cells is configured to output the second tracking signal to the control circuit based on the at least one second tracking word line signal.

12. The memory device of claim 11, wherein the first tracking bit line is configured to transmit the first tracking signal from the set of first tracking cells to the control circuit; and the second tracking bit line is configured to transmit the second tracking signal from the set of second tracking cells to the control circuit.

13. The memory device of claim 12, wherein a portion of the first tracking bit line and a portion of the second tracking bit line are arranged at opposite sides of the first set of tracking cells and the second set of tracking cells and extend along the first direction.

14. The memory device of claim 12, wherein a portion of the first tracking bit line and a portion of the second tracking bit line are arranged at a same side of the first set of tracking cells and the second set of tracking cell.

15. The memory device of claim 12, wherein a portion of first tracking bit line extends across the set of second tracking cells, or a portion of the second tracking bit line extends across the set of first tracking cells.

16. The memory device of claim 12, wherein a portion of the first tracking bit line is arranged in a first layer, and a portion of second tracking bit line is arranged in a second layer that is different from the first layer.

17. A method, comprising:

a control circuit outputting, based on a clock signal, at least one first tracking word line signal to a set of tracking cells which abuts an array of bit cells;

the set of tracking cells generating, during a read tracking operation, a first tracking signal to a first tracking bit line based on the at least one first tracking word line signal;

the control circuit outputting, in response to the first tracking signal, at least one second tracking word line signal to the set of tracking cells; and the set of tracking cells generating, during a write tracking operation, a second tracking signal to a second tracking bit line based on the at least one second tracking word line signal.

18. The method of claim 17, wherein the set of tracking cells comprises:

a set of first tracking cells abut a set of second tracking cells;

wherein first tracking cells in the set of first tracking cells are arranged in at least one first column, and the first tracking cells in the at least one first column are coupled in series with each other; and wherein second tracking cells in the set of second tracking cells are arranged in at least one second column, and the second tracking cells in the at least one second column are coupled in series with each other.

19. The method of claim 18, wherein
the control circuit outputting, based on the clock signal, the at least one first tracking word line signal to the set of tracking cells comprises:
   the control circuit outputting, based on the clock signal, the at least one first tracking word line signal to the set of first tracking cells;
wherein the set of tracking cells generating, during the read tracking operation, the first tracking signal based on the at least one first tracking word line signal comprises:
   the set of first tracking cells generating the first tracking signal based on the at least one first tracking word line signal;
wherein the control circuit outputting, in response to the first tracking signal, the at least one second tracking word line signal to the set of tracking cells comprises:
   the control circuit outputting, in response to the first tracking signal, the at least one second tracking word line signal to the set of second tracking cells; and
wherein the set of tracking cells generating, during the write tracking operation, the second tracking signal based on the at least one second tracking word line signal comprises:
   the set of second tracking cells generating the second tracking signal based on the at least one second tracking word line signal.

20. The method of claim 17, further comprising:
a decoder circuit, in response to the first tracking signal, disabling a first word line and enabling a second word line; and
the decoder circuit, in response to the second tracking signal, disabling the second word line.

* * * * *